(12) United States Patent
Zhang et al.

(10) Patent No.: US 10,915,133 B1
(45) Date of Patent: Feb. 9, 2021

(54) NON-DOMINANT POLE TRACKING COMPENSATION FOR LARGE DYNAMIC CURRENT AND CAPACITIVE LOAD REFERENCE GENERATOR

(71) Applicant: SanDisk Technologies LLC, Addison, TX (US)

(72) Inventors: Xiaofeng Zhang, San Jose, CA (US); Naresh Battula, Santa Clara, CA (US); Albert I-Ming Chang, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/800,260

(22) Filed: Feb. 25, 2020

(51) Int. Cl.
| | |
|---|---|
| *G05F 3/26* | (2006.01) |
| *G11C 13/00* | (2006.01) |
| *G11C 16/08* | (2006.01) |
| *G11C 16/16* | (2006.01) |
| *G11C 16/24* | (2006.01) |
| *G11C 16/26* | (2006.01) |
| *G11C 16/30* | (2006.01) |
| *G11C 16/34* | (2006.01) |

(52) U.S. Cl.
CPC ............ *G05F 3/262* (2013.01); *G11C 13/004* (2013.01); *G11C 13/0026* (2013.01); *G11C 13/0028* (2013.01); *G11C 13/0038* (2013.01); *G11C 13/0064* (2013.01); *G11C 13/0069* (2013.01); *G11C 16/08* (2013.01); *G11C 16/16* (2013.01); *G11C 16/24* (2013.01); *G11C 16/26* (2013.01); *G11C 16/30* (2013.01); *G11C 16/3459* (2013.01); *G11C 2013/0045* (2013.01); *G11C 2013/0078* (2013.01)

(58) Field of Classification Search
None
See application file for complete search history.

(56) References Cited

U.S. PATENT DOCUMENTS

| | | | |
|---|---|---|---|
| 6,754,121 | B2 | 6/2004 | Worley |
| 6,803,794 | B2 | 10/2004 | Martin et al. |
| 8,471,538 | B2 | 6/2013 | Pancholi et al. |
| 8,792,293 | B2 | 7/2014 | Singh et al. |
| 9,122,292 | B2 | 9/2015 | Pan et al. |
| 9,159,344 | B2 | 10/2015 | Mallary et al. |

(Continued)

*Primary Examiner* — James G Norman
(74) *Attorney, Agent, or Firm* — Vierra Magen Marcus LLP

(57) ABSTRACT

A voltage regulator circuit is presented that can generate a stable and well-regulated output level to supply loads that have large dynamic current and capacitive variation. A compensation circuit is added to introduce a zero that tracks the voltage regulator's non-dominant pole. The compensation circuit includes a compensation transistor, whose gate is connected to receive the same voltage as the regulator's load driving pass transistor, and a series combination of a capacitance and a tracking resistance connected in series between the compensation transistor's gate and a supply level, where the value of the tracking resistance depends on the current supplied to the load. The tracking resistance can be implemented as a diode connected NMOS through which the compensation transistor is connected to the low supply level, or a diode connected PMOS whose current tracks that of the compensation transistor through a current mirror.

20 Claims, 15 Drawing Sheets

(56) References Cited

U.S. PATENT DOCUMENTS

| | | |
|---|---|---|
| 9,224,466 B1 | 12/2015 | Chen et al. |
| 9,361,976 B2 | 6/2016 | Siau et al. |
| 9,552,882 B2 | 1/2017 | Tseng et al. |
| 9,564,215 B2 | 2/2017 | Balakrishnan et al. |
| 9,704,572 B2 | 7/2017 | Chen et al. |
| 10,304,550 B1 | 5/2019 | Nguyen et al. |
| 2003/0185076 A1 | 10/2003 | Worley |
| 2004/0164771 A1 | 8/2004 | Martin et al. |
| 2008/0157735 A1 * | 7/2008 | Liu .................. G05F 1/575 323/280 |
| 2014/0119093 A1 | 5/2014 | Singh et al. |
| 2014/0334038 A1 | 11/2014 | Mallary et al. |

* cited by examiner

NON-DOMINANT POLE TRACKING COMPENSATION FOR LARGE DYNAMIC CURRENT AND CAPACITIVE LOAD REFERENCE GENERATOR

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

DETAILED DESCRIPTION

Non-volatile memories and many other circuits have a need for voltage supply levels whose outputs are well-regulated to the be accurate and consistent, even when the current requirements or capacitance of the load changes rapidly. For example, when providing a supply voltage to a sense amplifier or providing a sensing voltage for reading memory cells, the amount of capacitance at the output of regulator circuit and the amounts of current being supplied from the regulator circuit can experience large and rapid changes. Voltage regulation circuits commonly exhibit poor phase margins across such rapid and large current and capacitance variations, resulting in a poorly regulated output voltage being supplied form the regulator circuit.

To address this issue, a voltage regulator circuit is presented that can generate a stable and well-regulated output level to supply loads that have large dynamic current and capacitive variation. A compensation circuit is added to introduce a zero that tracks the voltage regulator's non-dominant pole. The compensation circuit includes a compensation transistor, whose gate is connected to receive the same voltage as the regulator's load driving pass transistor, and a series combination of a capacitance and a tracking resistance connected in series between the compensation transistor's gate and a supply level, where the value of the tracking resistance depends on the current supplied to the load. The tracking resistance can be implemented as a diode connected NMOS through which the compensation transistor is connected to the low supply level, or a diode connected PMOS whose current tracks that of the compensation transistor through a current mirror.

Figure 1A:
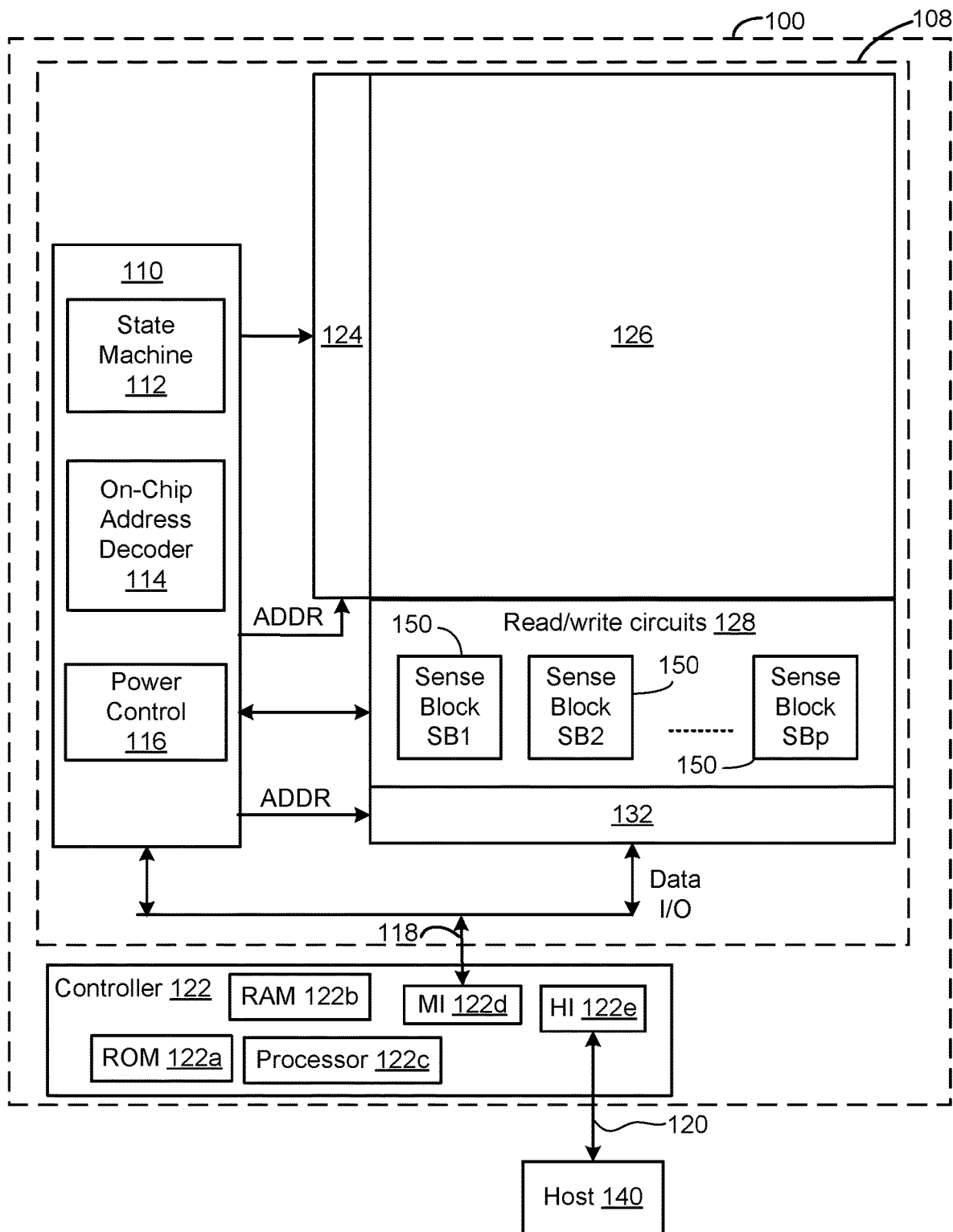
FIG. 1A is a functional block diagram of a memory device.

FIGS. 1A-5 describe examples of memory systems that can be used to implement the technology proposed herein. FIG. 1A is a functional block diagram of an example memory system 100. In one embodiment, the components depicted in FIG. 1A are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 150 including SB1, SB2, . . . , SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In other embodiments, state machine 112 can be replaced by a programmable microcontroller. Control circuitry 110 also includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers. More detail on voltage regulators that can be included as part of the power control module 116 are described below.

Figure 2:
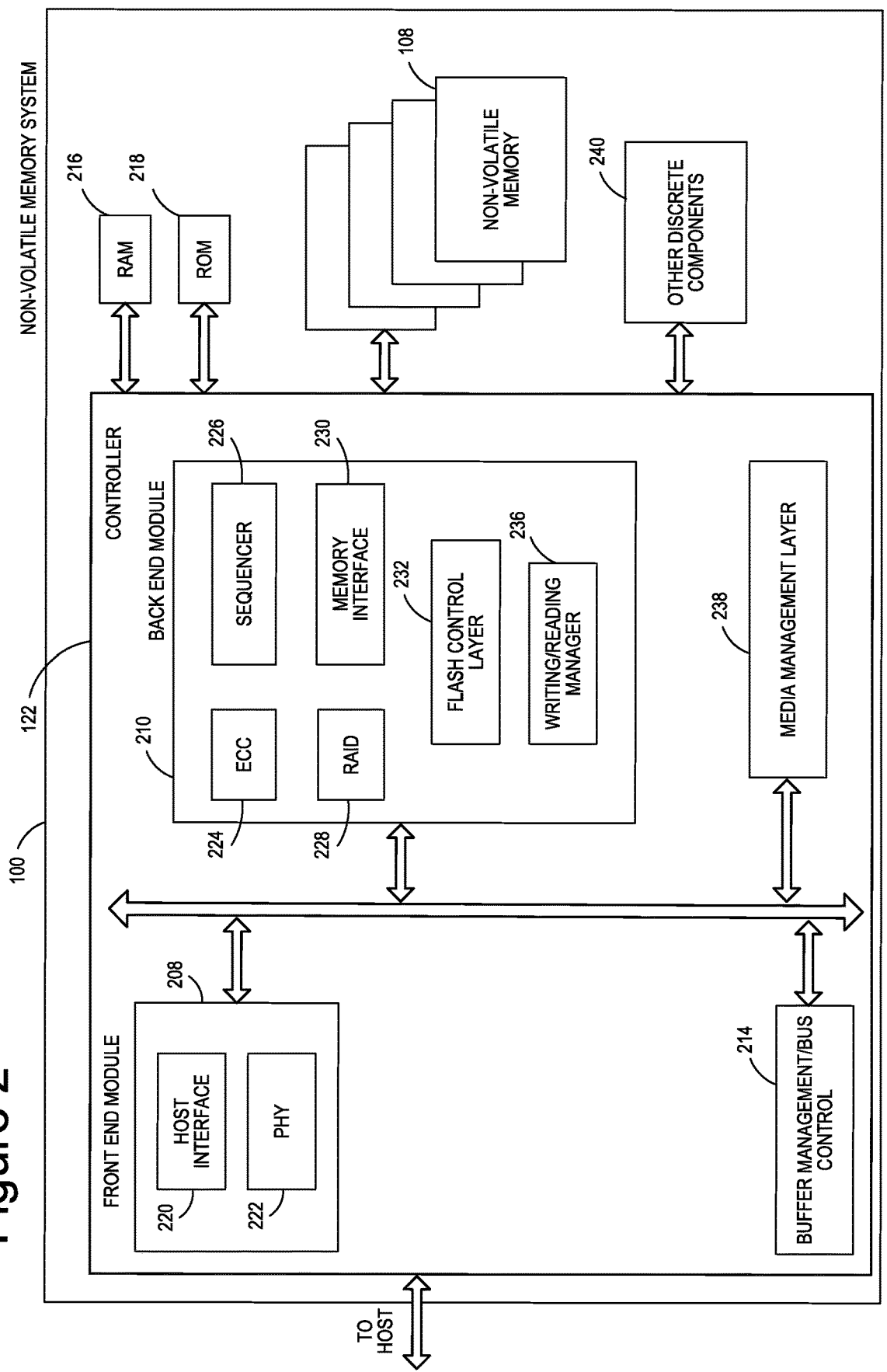
FIG. 2 is a block diagram depicting one embodiment of a memory system.

State machine 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data. Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other embodiments, the memory cells of a PCM memory can have their data state set or reset through use of current pulses. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
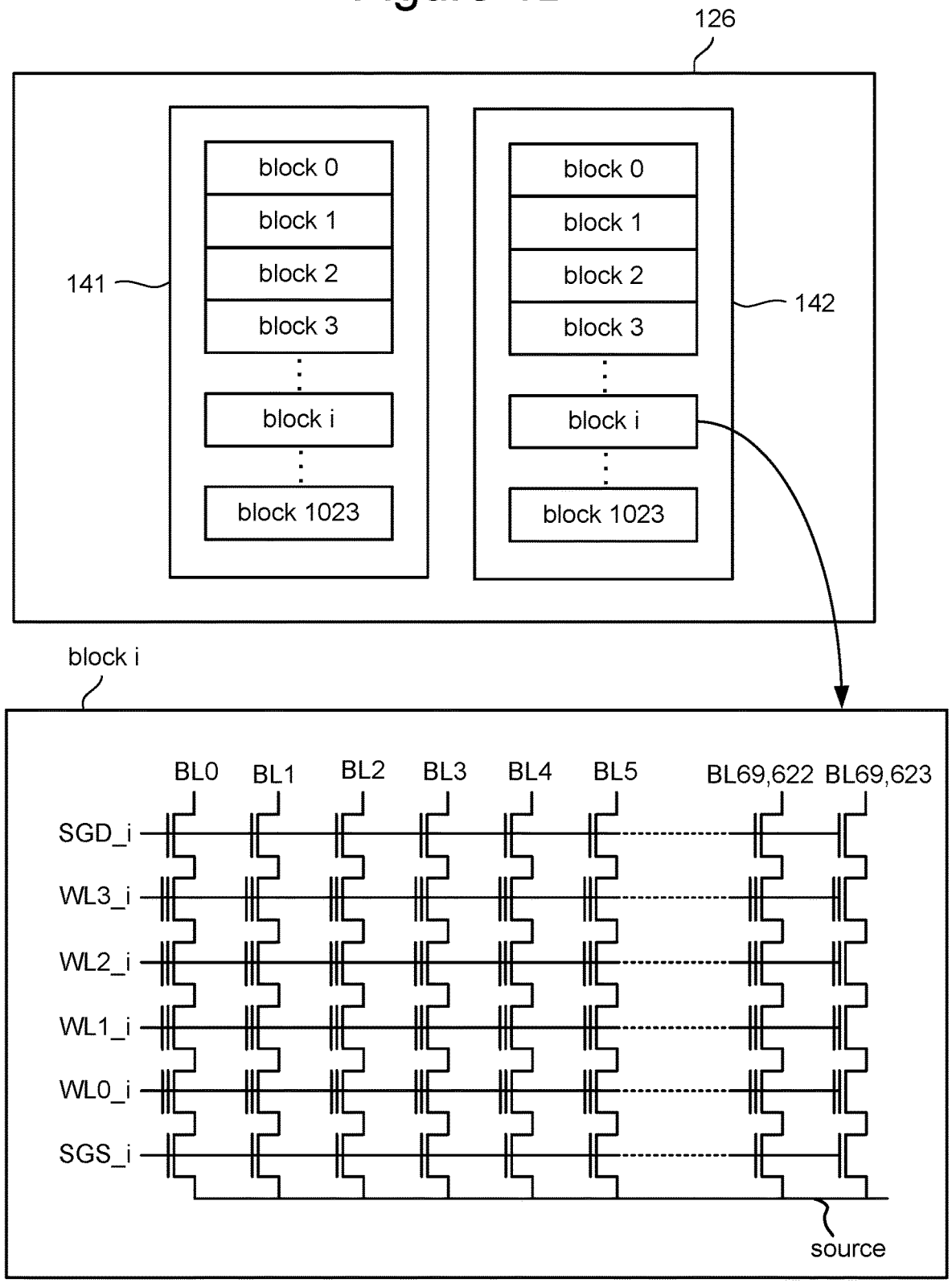
FIG. 1B is a block diagram depicting one example of a memory structure.

FIG. 1B depicts an example of memory structure 126. In one embodiment, an array of memory cells is divided into multiple planes. In the example of FIG. 1B, memory structure 126 is divided into two planes: plane 141 and plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1B includes memory cells that share word lines WL0_$i$, WL1_$i$, WL2_$i$ and WL3_$i$ and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1B shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data into the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flowcharts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of die 108. The MML 238 may be needed because: 1) the memory may have limited endurance; 2) the memory structure 126 may only be written in multiples of pages; and/or 3) the memory structure 126 may not be written unless it is erased as a block. The MML 238 understands these potential limitations of the memory structure 126 which may not be visible to the host. Accordingly, the MML 238 attempts to translate the writes from host into writes into the memory structure 126.

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
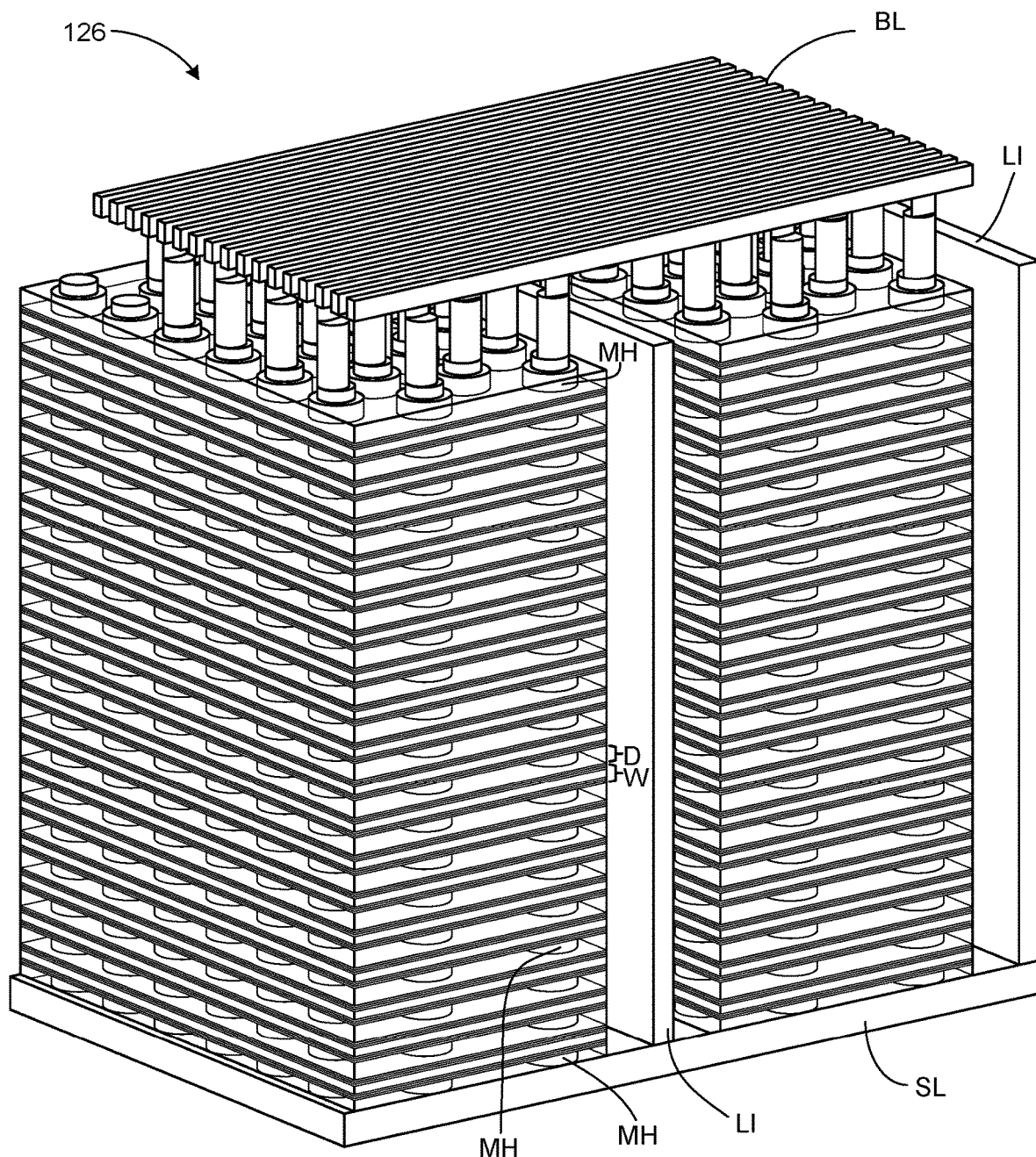
FIG. 3 is a perspective view of a portion of one embodiment of a monolithic three-dimensional memory structure.

FIG. 3 is a perspective view of a portion of one example embodiment of a monolithic three-dimensional memory structure 126, which includes a plurality memory cells. For example, FIG. 3 shows a portion of one block of memory. The structure depicted includes a set of bit lines BL positioned above a stack of alternating dielectric layers and conductive layers. For example, purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 4.

Figure 4:
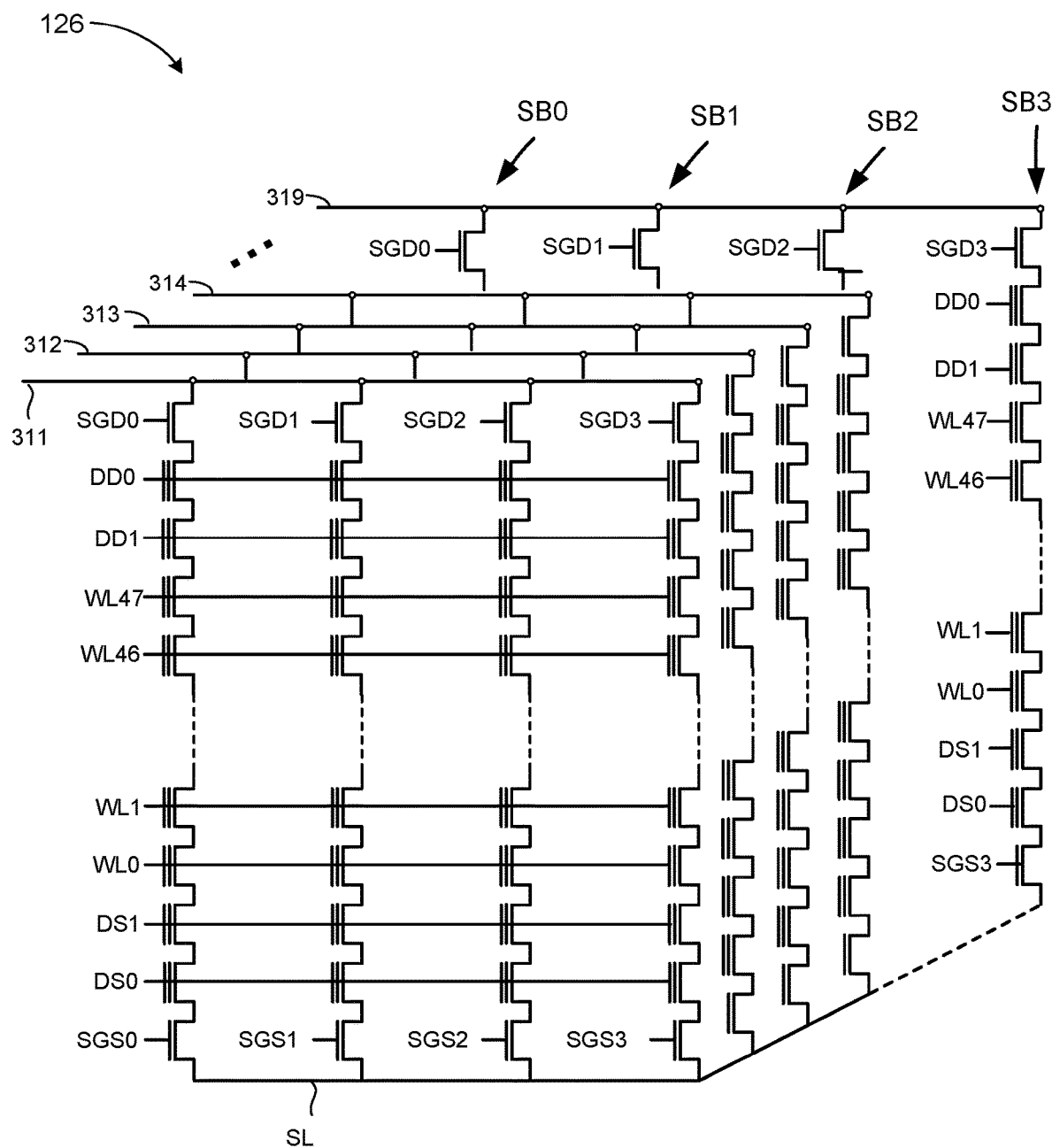
FIG. 4 is a schematic of a plurality of NAND strings.

FIG. 4 depicts an example 3D NAND structure and shows physical word lines WLL0-WLL47 running across the entire block. The structure of FIG. 4 can correspond to a portion of one of the blocks of FIG. 1B, including bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 5:
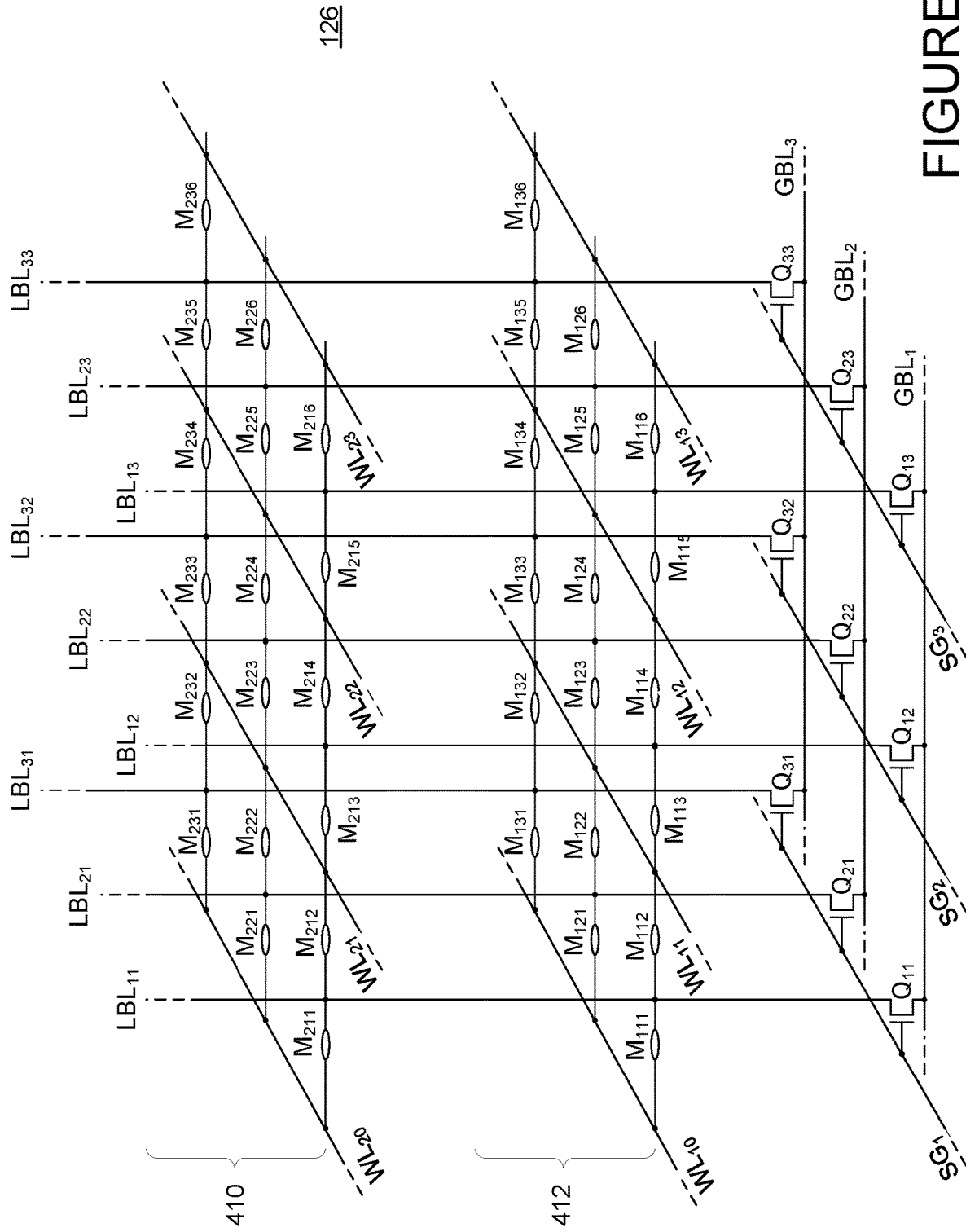
FIG. 5 depicts various embodiments of a portion of a three-dimensional memory array with a vertical cross-point structure.

FIG. 5 illustrates another memory structure that can be used for the structure 126 of FIG. 1A. FIG. 5 illustrates a three-dimensional vertical cross-point structure, the word lines still run horizontally, with the bit lines oriented to run in a vertical direction.

FIG. 5 depicts one embodiment of a portion of a monolithic three-dimensional memory array structure 126 that includes a first memory level 412 positioned below a second memory level 410. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 5, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 6:
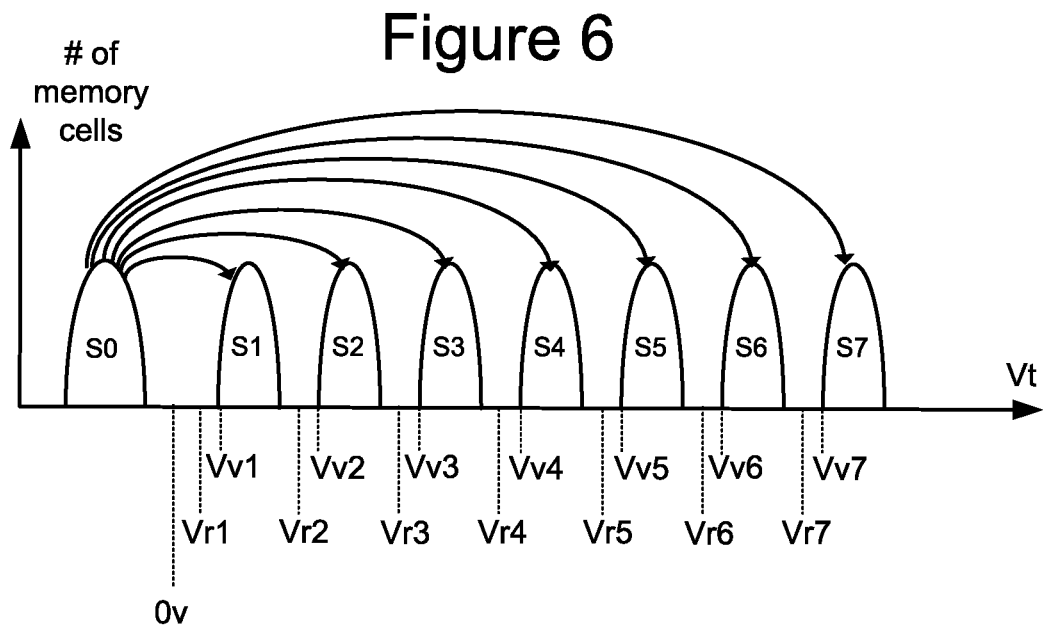
FIG. 6 depicts threshold voltage distributions in a three bit per cell embodiment.

The memory systems discussed above can be erased, programmed/written and read. At the end of a successful programming process, the threshold voltages of the memory cells should be within one or more distributions of threshold voltages for programmed memory cells or within a distribution of threshold voltages (Vts) for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
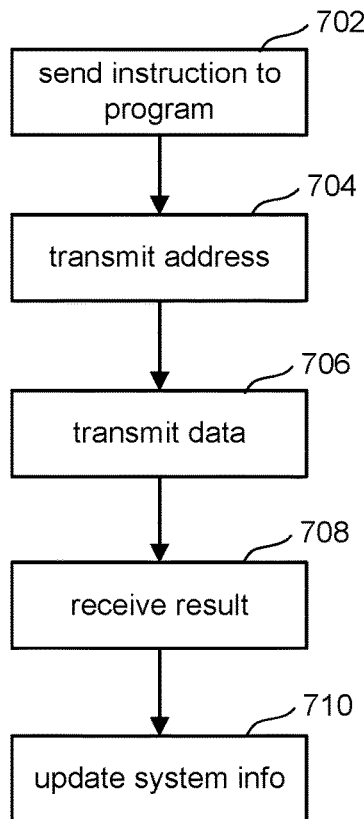
FIG. 7A is a flowchart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art. These code words are the data transmitted in step 706. Controller 122 (e.g., writing/reading manager 236) can also scramble the data prior to programming the data in the memory.

Figure 7B:
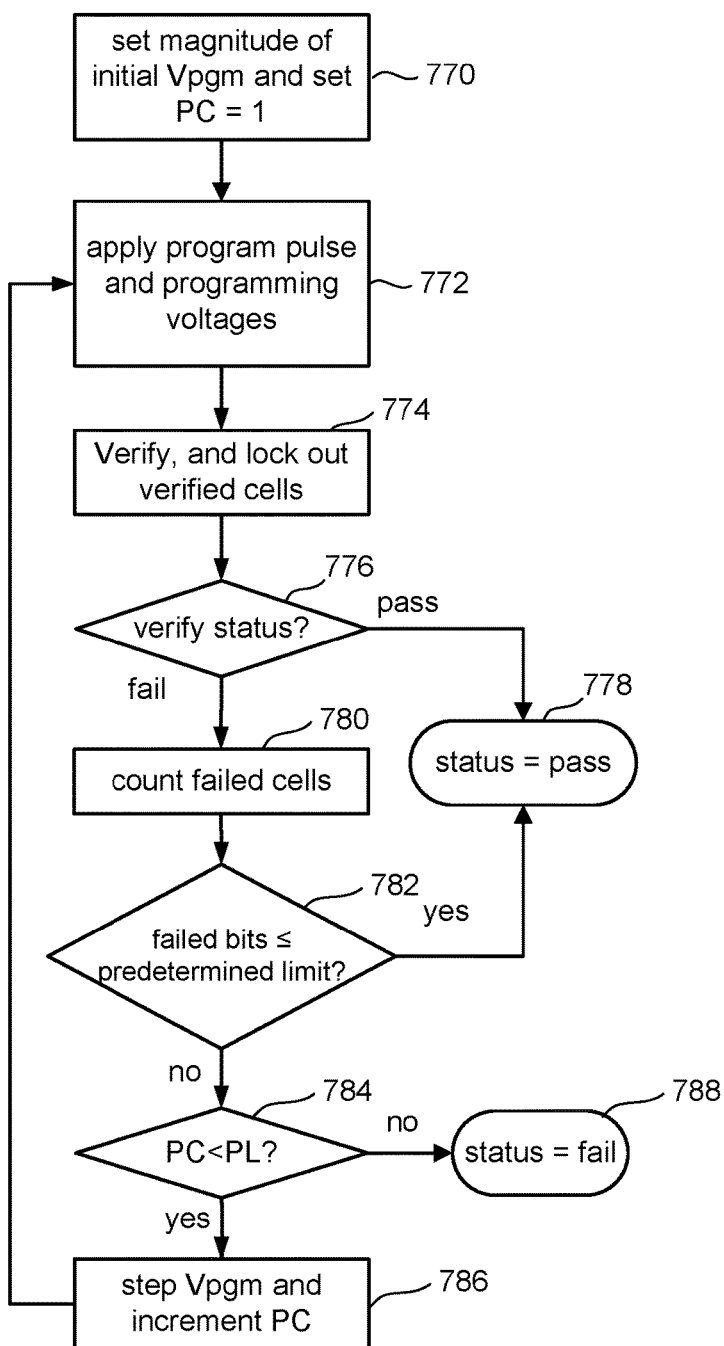
FIG. 7B is a flowchart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
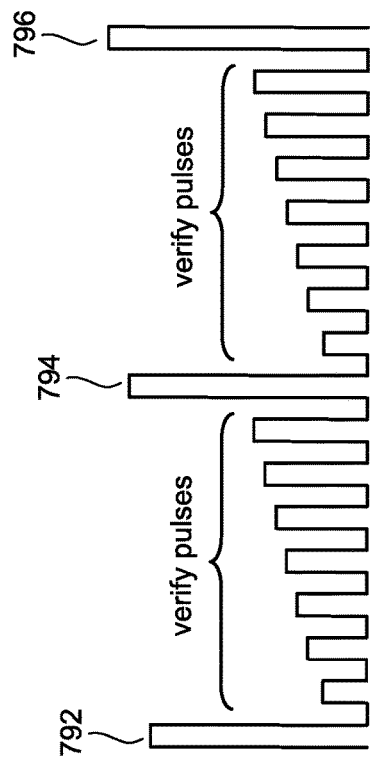
FIG. 7C depicts a word line voltage during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 8:
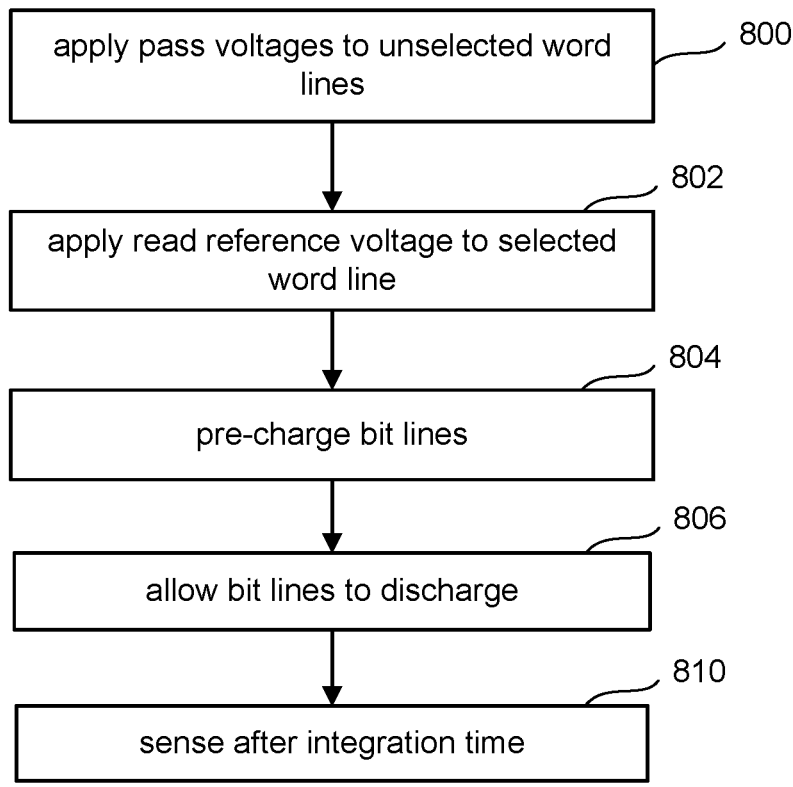
FIG. 8 is a flowchart describing one embodiment of a process for reading data from non-volatile memory cells.

FIG. 8 is a flowchart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0 v, or a small voltage near 0 v. In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 810. If the memory cell conducts in response to Vcgr, then the threshold voltage of the memory cell is less than Vcgr. If Vcgr=0 v and the memory cell turns on, then the memory cell is in the erased state and the data stored is 1. If Vcgr=0V and the memory cell does not turn on, then the memory cell is in the programmed state and the data stored is 0.

As described above, the control circuits of a memory circuit use a number of different voltage levels in the course of its operation, such the different voltage levels used by the sense amplifiers, various bias levels used for sensing when reading and verifying selected memory cells, programming voltages, and other voltage levels by which the memory array is biased, as well as the voltages used by the various peripheral circuit elements. Referring back to FIG. 1A, the control circuits used in performing memory operations (e.g., read, write, program) can include on-die control circuitry 110 (including state machine 112, on-chip address decoder 114, and power control 116), along with decoders, logic, drivers and other biasing circuitry in row decoder 124, column decoder 132, and read/write circuits 128 (including the sense blocks 150). In the block diagram of FIG. 1A, the supply for the voltage levels is represented as the power control 116 of the memory circuit 108. A memory circuit is typically connected to receive a low supply level, or ground, and a high supply level. The memory circuit then generates the needed operating voltages by stepping down the received high supply voltage level or by raising it, such as through the use of charge pumps. Whether a voltage level on the memory circuit is stepped down from, raised from, or at the received high voltage supply level, the memory circuit will generally regulate these on-chip supply voltage levels by use of voltage generators to regulate the various voltage levels. The following presents embodiments for such reference generation systems.

Although the following discussion is mainly presented in the context of non-volatile memory circuits and for uses such as providing the various voltage levels used with the sense amplifiers of the sense blocks 150 of FIG. 1, they can be used more generally for other applications. The techniques and circuitry presented here for reference voltage generator/regulators are particularly applicable to low-dropout, or LDO, regulators, which are DC linear voltage regulators that can regulate the output voltage even when the supply voltage is very close to the output voltage. The compensation methods described are useful when the circuit is used to supply large dynamic currents and large dynamic loading ranges, whether for non-volatile memory circuits or in other applications.

More specifically, the embodiments presented in the following address the issues of phase margin for reference voltage generator/regulators at dynamic loads and of LHP (left-hand plane) zero compensation not covering the full range of load currents experienced by the regulator. The presented regulator circuit addresses these issues by use of non-dominant pole tracking to improve the phase margin and to cover the full range of capacitive loads and current loads.

Figure 9:
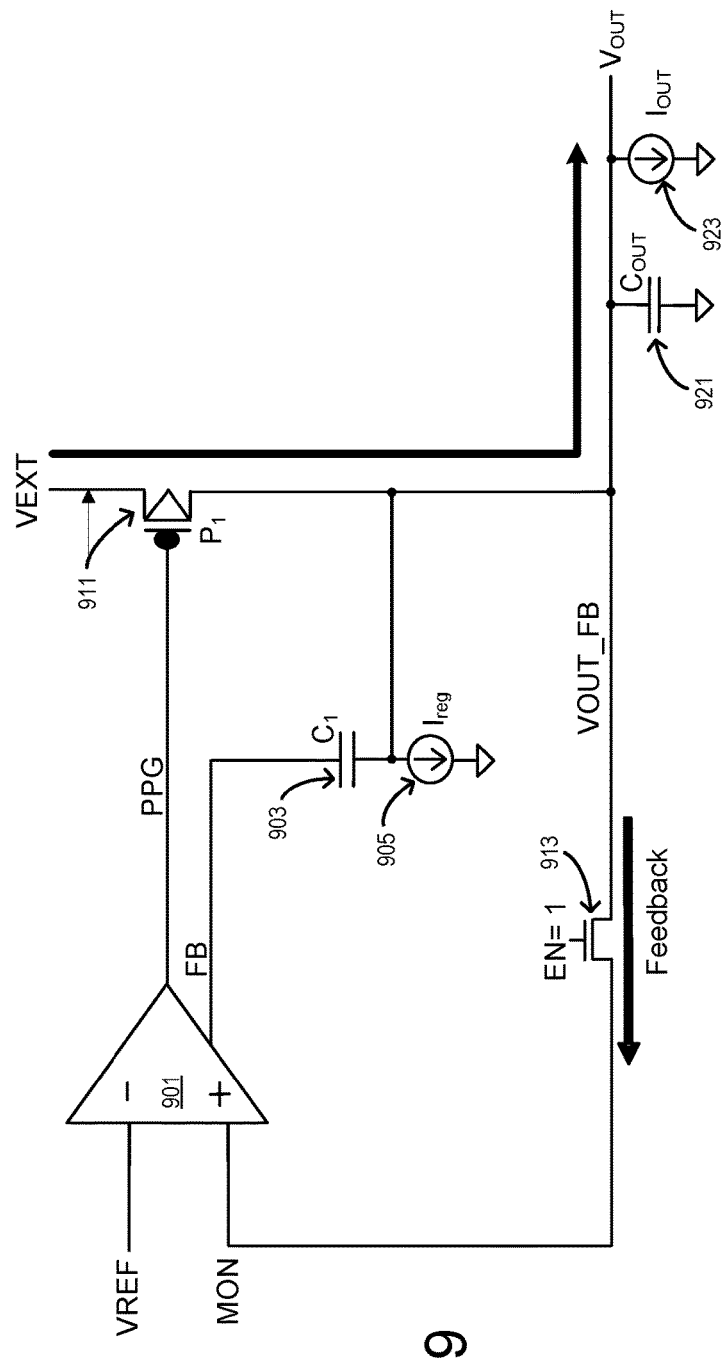
FIG. 9 illustrates an example of regulator circuit without a compensation network added.

FIG. 9 illustrates an example of a regulator circuit without a compensation network added. An error amplifier 901 is connected with its output PPG to supply a PMOS supply or pass transistor P1 911 that is connected between a high supply level Vext and the regulator's output node supplying $V_{OUT}$. In a typical application on a memory circuit, the voltage levels involved will be on the order of a few volts. The output node is shown to drive a capacitive load $C_{OUT}$ 921 and current load $I_{OUT}$ 923. A first input (the − input) of the error amplifier 901 is connected to receive a reference voltage, such as from, or derived from, a band-gap circuit or other source to provide a well-defined reference level. A second input (the + input) of the error amplifier 901 is connected to receive feedback VOUT_FB from the $V_{OUT}$ node through a switch 913. A second output FB of the error amplifier 901 is connected to ground through the series combination of a capacitance $C_1$ 903 and regulator current $I_{reg}$ 905 to ground, where the intermediate node between $C_1$ 903 and $I_{reg}$ 905 is connected to the $V_{OUT}$ node.

Figure 10:
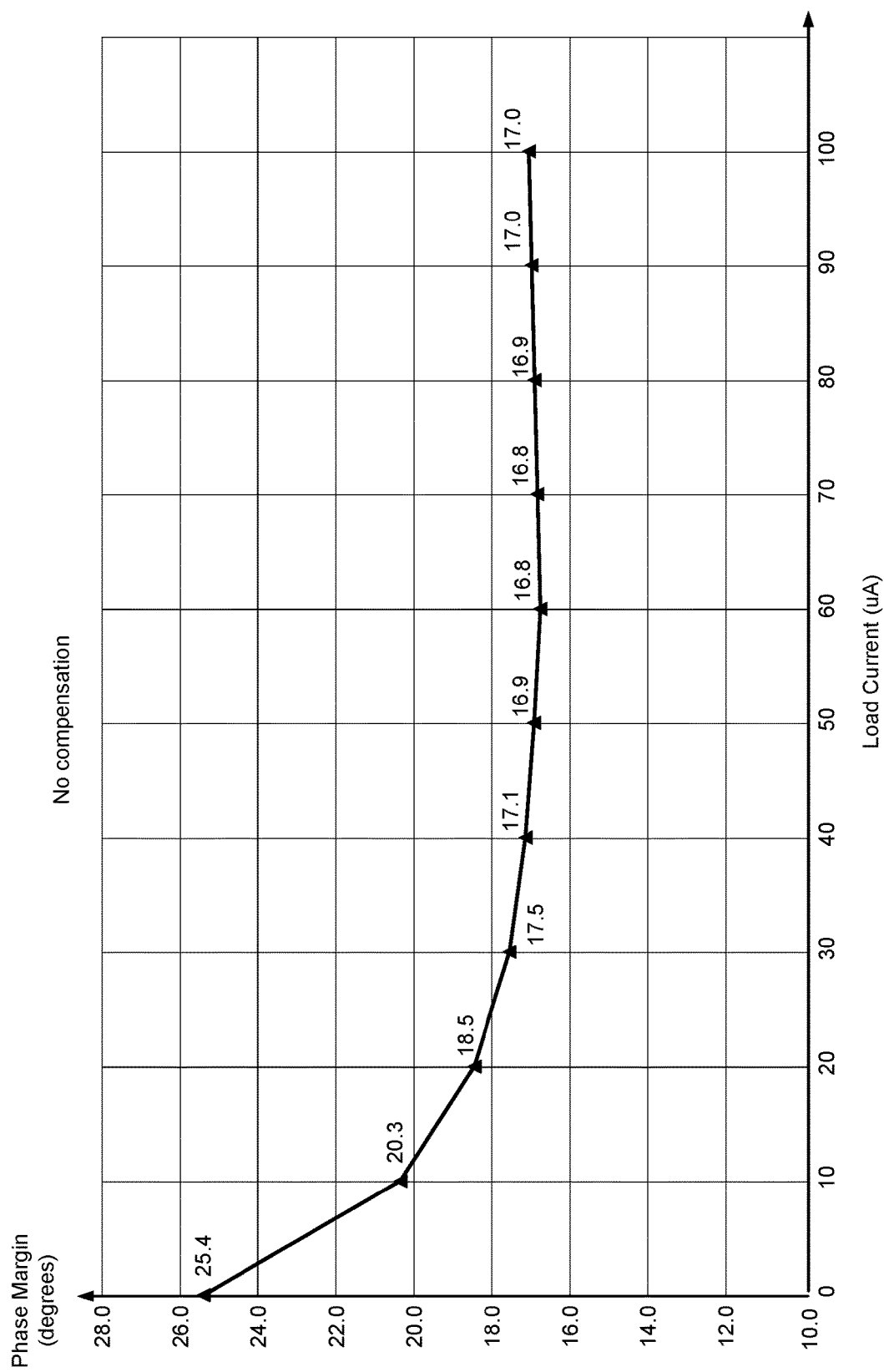
FIG. 10 is a plot of phase margin versus load current for an example of an uncompensated regulator circuit as in FIG. 9.

The arrangement of FIG. 9 can be used to provide a regulated output $V_{OUT}$. In applications such as for providing sense amplifier voltages of the sense blocks 150 of FIG. 1 or the sensing voltages for read and verify operations (discussed above with respect to FIG. 6), the $V_{OUT}$ needs to be very accurately regulated across large dynamic variations of load and current levels and also across process, voltage, and temperature (PVT) variations. The operation of a memory circuit can cause large and rapid swings in the load seen on the output of the regulator circuit and the regulator circuit exhibits poor phase margin across changes in load current, which can lead to oscillations of the output. FIG. 10 illustrates the phase margin for an example of uncompensated regulator circuit of FIG. 9.

FIG. 10 is a plot of phase margin versus load current for an example of an uncompensated regulator circuit as in FIG. 9. In FIG. 10, the vertical axis is the circuit's phase margin in degrees and horizontal axis is the load current in microamps, where the load current also includes any leakage or quiescent current. As shown, at zero load current the phase is 25.4° and decreases fairly rapidly to around 17°. Such low phase margins can result in oscillations of the regulator's output and, for stability, a phase margin of 45° is preferred.

One compensation technique to improve the phase is through use of left half plane zero compensation, such as by introduction of a resistance and capacitance connected in series between the error amplifier's output and the high voltage level. This sort of compensation can be used to improve the phase margin, but this will be primarily at a specific load value. This can provide a phase margin of 45° at a particular load, but this margin will not cover the range of loads seen with the sort of dynamic load conditions seen in applications such as for a non-volatile memory circuit.

Figure 11:
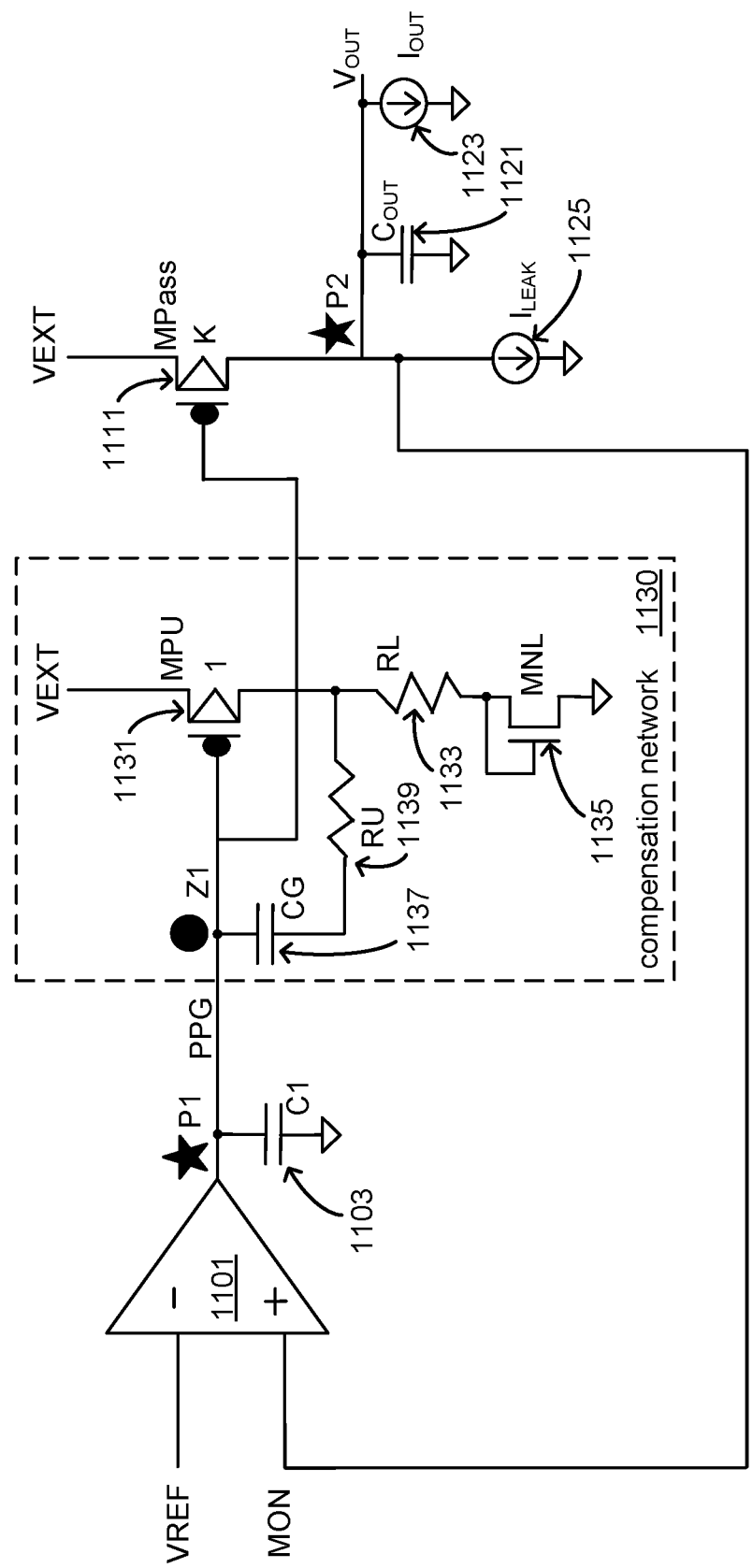
FIG. 11 is an embodiment of a regulated voltage supply circuit including non-dominant pole compensation.

FIG. 11 is an embodiment of a regulated voltage supply circuit including non-dominant pole compensation. Similarly to FIG. 9, an error amplifier 1101 has an output PPG that is connected to the control gate of, and serves as the input of, a supply, or pass, PMOS transistor MPass 1111, where MPass 1111 is connected between the high supply level (VEXT) and the output node to supply $V_{OUT}$ to the load connected. The load is represented by the capacitive load $C_{OUT}$ 1121 and current load $I_{OUT}$ 1123. A leakage or quiescent current $I_{LEAK}$ 1125 is also included to represent leakage from the output node, which is present even when there is not an actively driven load, and which in a memory circuit application will typically have a value somewhere in the range of 0 µA to 100 µA. The error amplifier 1101 is connected to receive a reference voltage level VREF at one input terminal (here the − input) and to receive feedback MON from the output node at the other input terminal (here the + input). A capacitance C1 1103 is connected to the output of the error amplifier 1101.

FIG. 11 also includes a compensation network 1130 for the non-dominant pole of the regulator circuit, which also receives the voltage level on PPG at its input. The compensation network 1130 includes a PMOS transistor MPU 1131 whose gate is connected to the output PPG of the error amplifier 1101, and which is connected between the high supply level (VEXT) and the low supply level (or ground). MPU 1131 is connected to ground through the series connected pair of a resistor RL 1133 and a diode connected NMOS transistor MNL 1135. In the embodiment of FIG. 11, the PMOS MPU 1131 is sized relative to the PMOS MPass 1111 at a ratio of 1:K, where K is larger than 1. As both of MPU 1131 and MPass 1111 have their gates connected to the output PPG of the error amplifier 1101 and are connected between VEXT and ground, the current through MPU 1131 will be proportional to the current through MPass 1111. Consequently, the current through MPU 1131 will track the current supplied to the load, but be reduced by a factor of 1/K. The compensation network 1130 also includes a capacitor CG 1137 and resistor RU 1139 connected between the output of the error amplifier 1101 and the node between MPU 1131 and RL 1133.

Figure 12:
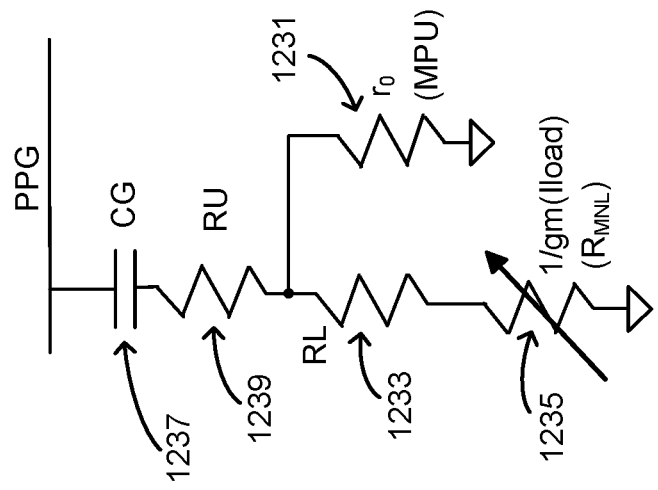
FIG. 12 is a small signal model of the compensation circuit of FIG. 11.

FIG. 12 shows a small signal model of the compensation circuit of FIG. 11. Connected between the output PPG from the error amplifier 1101 and ground are the series connected combination of, from top to bottom, of CG 1237, RU 1239, RL 1233, and the resistance RMNL 1235 corresponding to the resistance of the diode connected transistor MNL 1135 of FIG. 11. A resistance $r_0$ 1231, corresponding to the resistance of the PMOS MPU 1131 from FIG. 11, is connected between the node intermediate to RU 1239 and RL 1233 and ground. Having the two resistances RL 1233 and RU 1239 allows RL 1233 to balance $r_0$ 1231, allowing for using a bigger RL 1233 for a bigger $r_0$ 1231, and lets the RU 1239 be selected to extend the range of the network.

The resistance RMNL 1235 of the diode connected NMOS 1135 will be 1/gm, where gm is the transconductance of compensation transistor MPU 1131. The resistance of RMNL 1235 will depend on the current through MPU 1131: if $V_{PPG}$ is the voltage on PPG driving MPU 1131 and $I_{MPU}$ is the current through MPU 1131, then $gm=I_{MPU}/V_{PPG}$. Because of the 1:K sizing ratio of MPU 1131 to MPass 1111, $I_{MPU}=I_{LOAD}/K$. Consequently, $gm=gm(I_{LOAD})$ and the resistance RMNL 1235 is a function of the load seen at the output of the regulator circuit. This allows the compensation network to respond dynamically changes in the load and, more specifically, provides a load dependent zero to help cancel the effects of the regulator's non-dominant pole.

The compensation circuit 1130 uses the transconductance gm of the tracking transistor MPU 1131 to copy the current from pass device MPass 1111 with a 1:K ratio. Depending on the load change, the error amplifier 1101 drives the gate voltage PPG and controls the pass device MPass 1111 current with the same current copied to the compensation circuit with a 1/K reduction. The compensation current through MPU 1131 is also the current to the diode MNL 1135, which consequently also tracks gm of the pass device MPass 1111 with same ratio.

As illustrated by the analysis of the small signal model of FIG. 12, the diode MNL 1135 adds a resistance RMNL 1235 of 1/gm to the series resistor RL 1233 and is in parallel with MPU device impedance $r_0$ 1231. The total impedance with series capacitor CG 1237 provides the tracking LHP zero. The diode MNL 1135 and the resistor RL 1133 values are chosen to place the zero above the second pole of the regulator. To have a greater gm requires more current density, while at the same time a greater gm eliminates the effective impedance, which varies as 1/gm.

At lower load currents the circuit tracks the output pole and improves the phase margin. At higher load currents the circuit clamps the $V_{OUT}$ to the power supply level (VEXT). In typical implementations, the quiescent current of error amplifier 1101 increases from ~30 uA to ~50 uA at higher load currents. The pole and zero locations with gm tracking at lower load currents are given by:

$$P_1=1/(r_1*C_1);$$

$$F_Z=1/((((RL+1/gm)\|r0)+RU)*CG);\text{ and}$$

$$P_2=1/(r_2*C_{OUT}).$$

In the above, $P_1$ is the dominant pole, corresponding to the output of the error amplifier 1101 as marked by the star on FIG. 11; Fz is the zero, as marked by the circle, introduced by the compensation circuit 1130; and $P_2$ is the non-dominant pole, corresponding to the output node as marked by the star on FIG. 11. In these expressions, $r_0$ is the impedance from MPU 1131, $r_1$ is the impendence through the first stage (i.e., the error amplifier 1101) of the regulator circuit; and $r_2$ is the impendence from MPass 1111.

Another feature of the compensation circuit 1130 of FIG. 11 is that as it can be formed on the integrated circuit together with the other elements of the regulator circuit. This means that all the elements will see the same process, voltage and temperature variations. The results in the non-dominant pole compensation having a high degree of PVT insensitivity.

Figure 13:
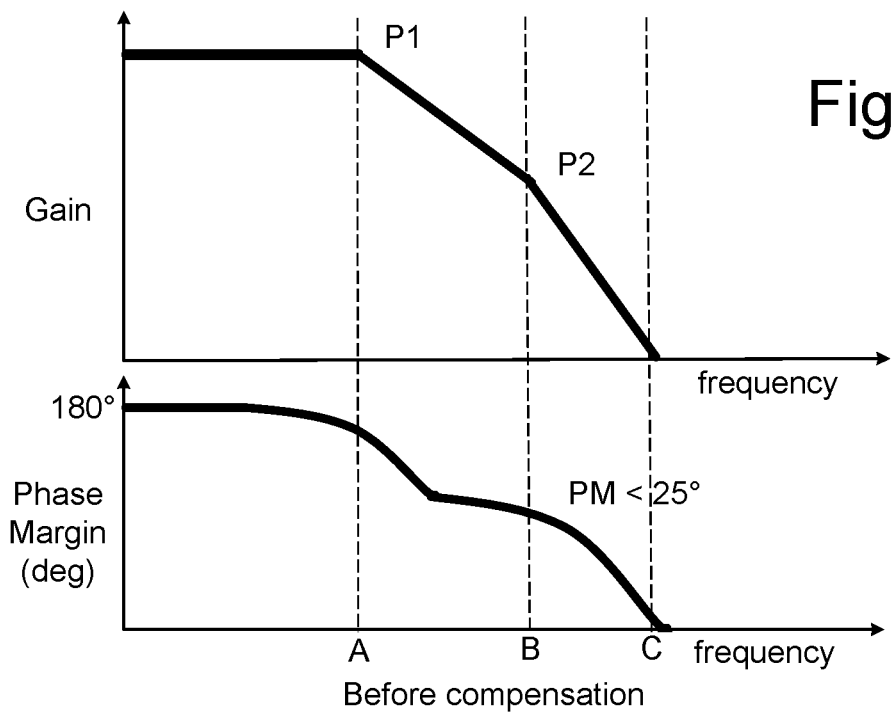
FIGS. 13 and 14 illustrate the frequency dependence of the gain and phase margin of the regulator circuit of FIG. 11 respectively without and with the compensation network.
Figure 14:
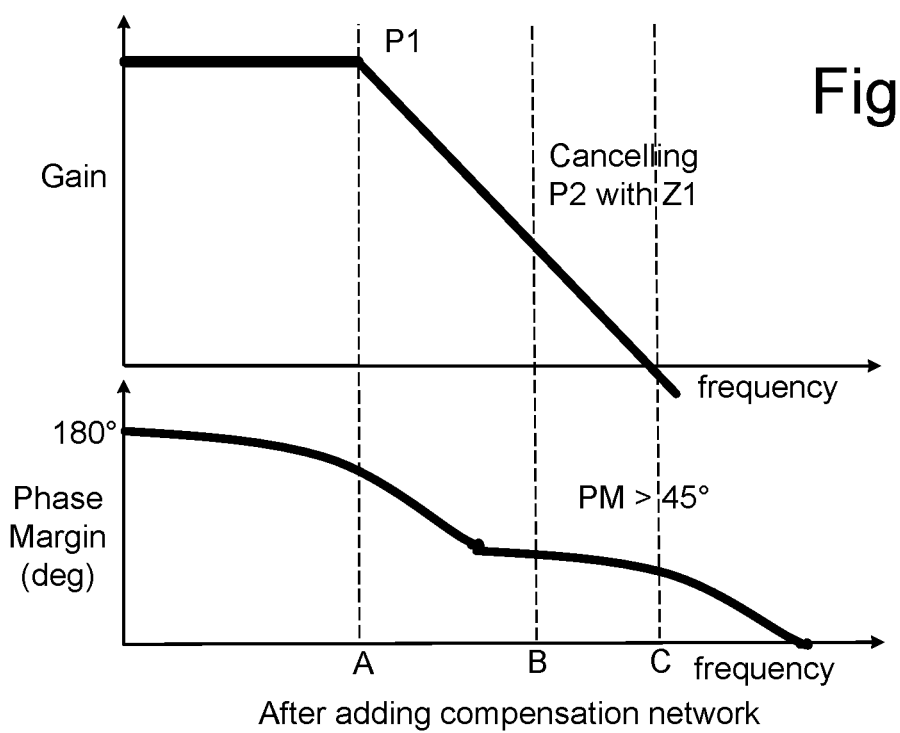

FIGS. 13 and 14 illustrate the frequency dependence of the gain and phase margin of the regulator circuit of FIG. 11 respectively without and with the compensation network 1130. At top, FIG. 13 illustrates the gain of the circuit of FIG. 11 as a function of frequency of load variation when the compensation circuit 1130 is absent. Starting at a frequency of zero, the gain stays flat until the first pole $P_1$ at the frequency marked A, after which it kinks downward until the non-dominant pole $P_2$ at the frequency marked B, where the gain decreases more rapidly until it hits zero at the frequency marked C.

The lower part of FIG. 13 shows the phase margin of the circuit of FIG. 11 as a function of frequency of load variation when the compensation circuit 1130 is absent. The phase margin FM starts at 180° and rolls off increasingly rapidly until somewhat past $P_1$, where it levels off before beginning to roll off more rapidly again until going to 0° at frequency C. In particular, above frequency B (corresponding to $P_2$) the phase margin falls below 25°, which can result in instability of the regulator output.

At top, FIG. 14 illustrates the gain of the circuit of FIG. 11 as a function of frequency of load variation when the compensation circuit 1130 is present. Starting at a frequency of zero, the gain stays flat until the first pole $P_1$ at the frequency marked A, after which it kinks downward. The transconductance in FIG. 14 continues downward linearly until it hits zero at frequency C, lacking the second kink of FIG. 13 as the zero from the compensation network 1130 cancels off the pole from $P_2$ at frequency B.

The lower part of FIG. 14 shows the phase margin of the circuit of FIG. 11 as a function of frequency of load variation when the compensation circuit 1130 is included. The phase margin FM again starts at 180° and rolls off increasingly rapidly until somewhat past $P_1$, where it levels off before beginning to roll off more rapidly until going to 0° at frequency C. Relative to FIG. 13, though, the phase margins decrease less rapidly as the frequency increases. In particular, above frequency B (corresponding to $P_2$) and frequency C, the phase margin stays 45°, providing stability for the regulator output at high frequency load switching.

As illustrated with respect to FIG. 14, the non-dominant pole tracking circuit technique presented here works with a broad range of frequencies. Unlike a typical fixed LHP zero, the circuit of FIG. 11 provides an LHP zero that tracks the non-dominant pole. As the output of the error amplifier 1101 provides the same voltage to both MPass 1111 and MPU 1131, MPU 1131 copies the same current as provided to the load, but reduced by a factor of 1/K, and supplies the current $I_{MPU}=I_{LOAD}/K$ to the MNL diode 1135. This results in the diode MNL 1135 providing a resistance inversely proportional to the transconductance of MPU 1131, and hence to the transconductance of MPass 1111, connected in series with the transistor RL 1133, so that the total impedance with series capacitor CG 1137 provides an LHP zero that tracks the non-dominant pole $P_2$. At lower load currents, the regulator circuit tracks the output pole and improves the phase margin, while at higher load currents the circuit clamps to the power supply with $V_{OUT}$ going to VEXT.

Figure 15:
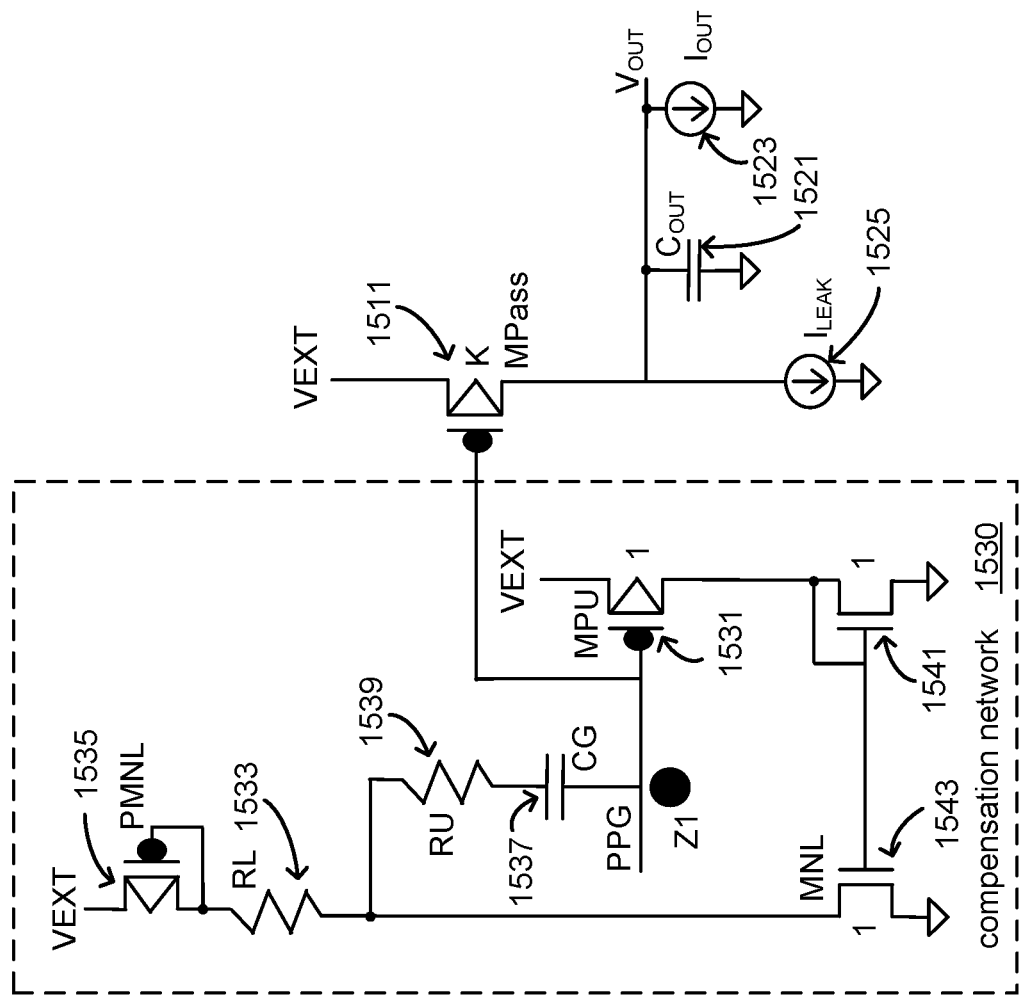
FIG. 15 illustrates an alternate embodiment in which the tracking resistance is implemented as a PMOS device.

FIG. 15 illustrates an alternate embodiment in which the tracking resistance is implemented as a PMOS device. In FIG. 15, the second stage is taken to be the same as in the embodiment of FIG. 11 where the tracking resistance is an NMOS device, including the supply or pass transistor MPass 1511 to supply the load, a current load represented at $I_{LOAD}$ 1523, a capacitive load represented at $C_{OUT}$ 1521, and a leakage/quiescent current $I_{LEAK}$ 1525. The input node for the pass transistor MPass 1511 and compensation network 1530 is again connected to output voltage of the error amplifier, where the error amplifier supplying PPG and the feedback loop from $V_{OUT}$ can also be as shown in FIG. 11 for the error amplifier 1101.

The compensation network 1530 again includes a PMOS MPU 1531 connected between VEXT and ground whose gate is connected to receive the error amplifier's output PPG and which is sized at a 1:K ratio with respect to MPass 1511. The compensation transistor MPU 1531 is now connected to ground through a first, diode connected NMOS transistor 1541 of a current mirror, that also includes the second NMOS transistor MNL 1543, whose control gate is commonly connected with the control gate of the NMOS 1541. NMOS transistor 1541 and NMOS transistor MNL 1543 are similar sized so that the current through each will be the same. The current though NMOS transistor 1541, and consequently though NMOS transistor MNL 1543, will be the same as through the compensation transistor MPU 1531, which can also be sized the same as NMOS transistor 1541 and NMOS transistor MNL 1543. In the second leg of the current mirror, PMOS PMNL 1535, RL 1533 and MNL 1543 are connected in series between VEXT and ground. The diode connected PMOS device PMNL 1535 now acts as the tracking resistance where, as the current through PMNL 1535 is the same as the current through MPU 1531 due to the current mirror arrangement, the resistance of PMNL 1535 is again 1/gm. RU 1539 and CG 1537 are now connected in series between the PPG line supplying the gates of MPU 1531 and MPass 1531 and a node intermediate to RL 1533 and MNL 1543. The compensation network 1530 will introduce the same zero as for the compensation network 1130 in which the tracking resistance is implemented as an NMOS device.

For either of the embodiments of FIG. 11 and FIG. 15, the zero introduced by the compensation circuit 1130/1530 tracks the second pole and improves the phase margin at low load currents. At higher loads, the circuit clamps to the supply level and creates no disturbance in normal operation. The result is a regulator circuit that improves the power supply rejection ratio (PSRR) of an uncompensated regulator circuit.

Figure 16:
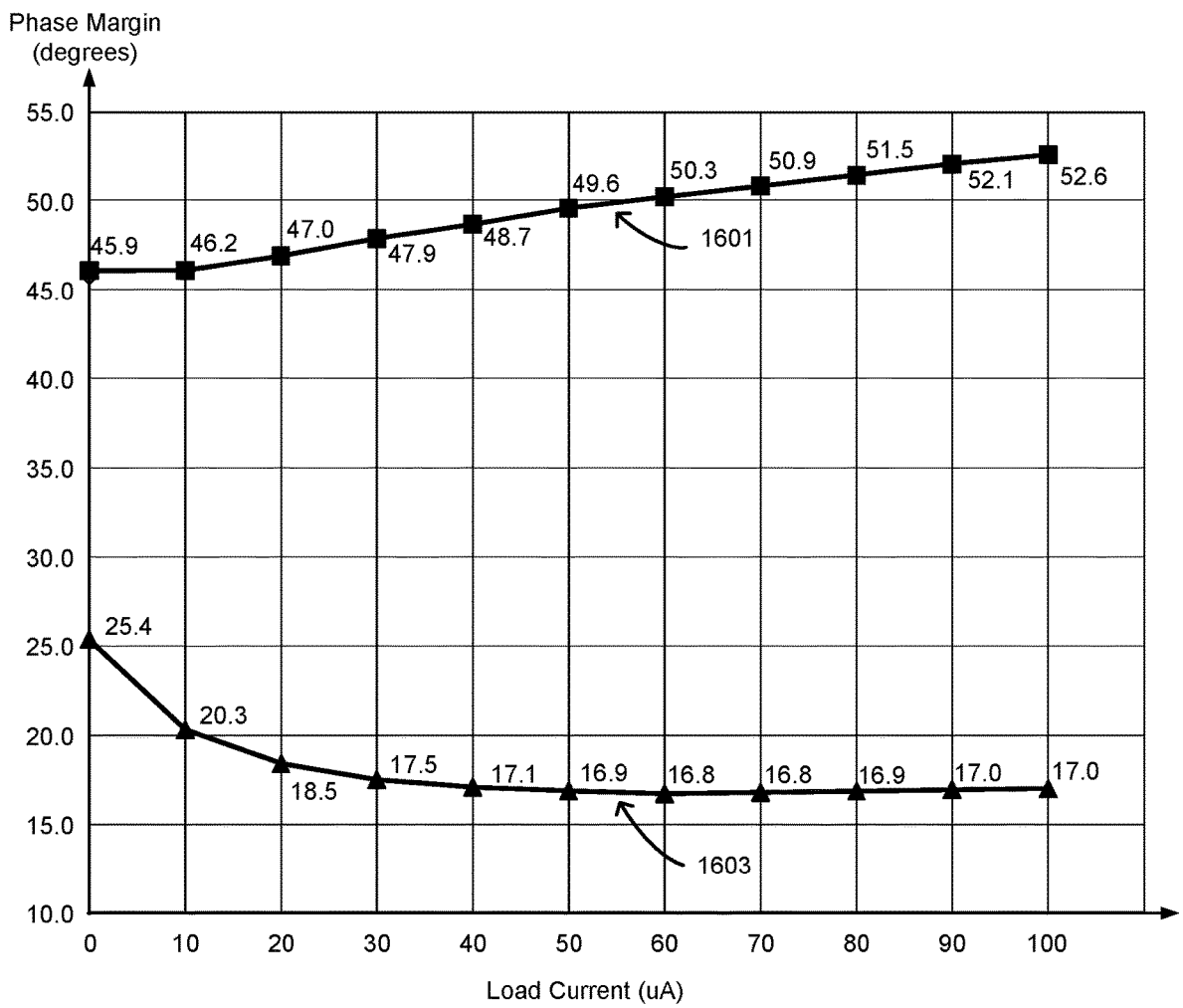
FIGS. 16 and 17 illustrate the phase margin using the gm tracking compensation circuit at lower current loads and higher current loads, respectively.
Figure 17:
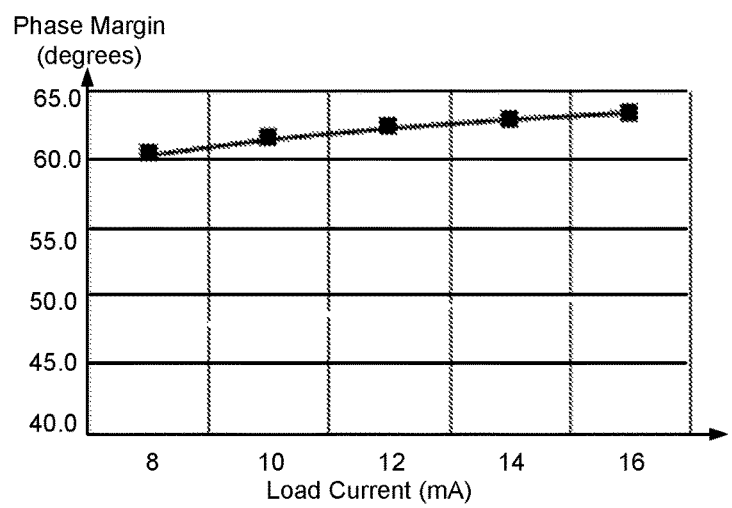

FIGS. 16 and 17 illustrate the phase margin using the gm tracking compensation circuit at lower current loads and higher current loads, respectively. FIG. 16 shows the phase margin in degrees versus load current in μA over a range of 0 μA to 100 μA using the gm tracking method at 1601. As shown, the phase margin starts at 45.9° for no load current and increases to 52.6° for a load of 100 μA. For comparison, the phase margin from FIG. 10 for the uncompensated circuit is shown at 1603. FIG. 17 shows the phase margin in degrees versus load current in mA over a range of 8 mA to 16 mA using the gm tracking method, where the phase margin starts at 60.4° at 8 mA current and increases to 63.4° at 16 mA. Consequently, the phase margin is above 45° from zero load to currents of over 10 mA, resulting in a stable regulated output.

Figure 18:
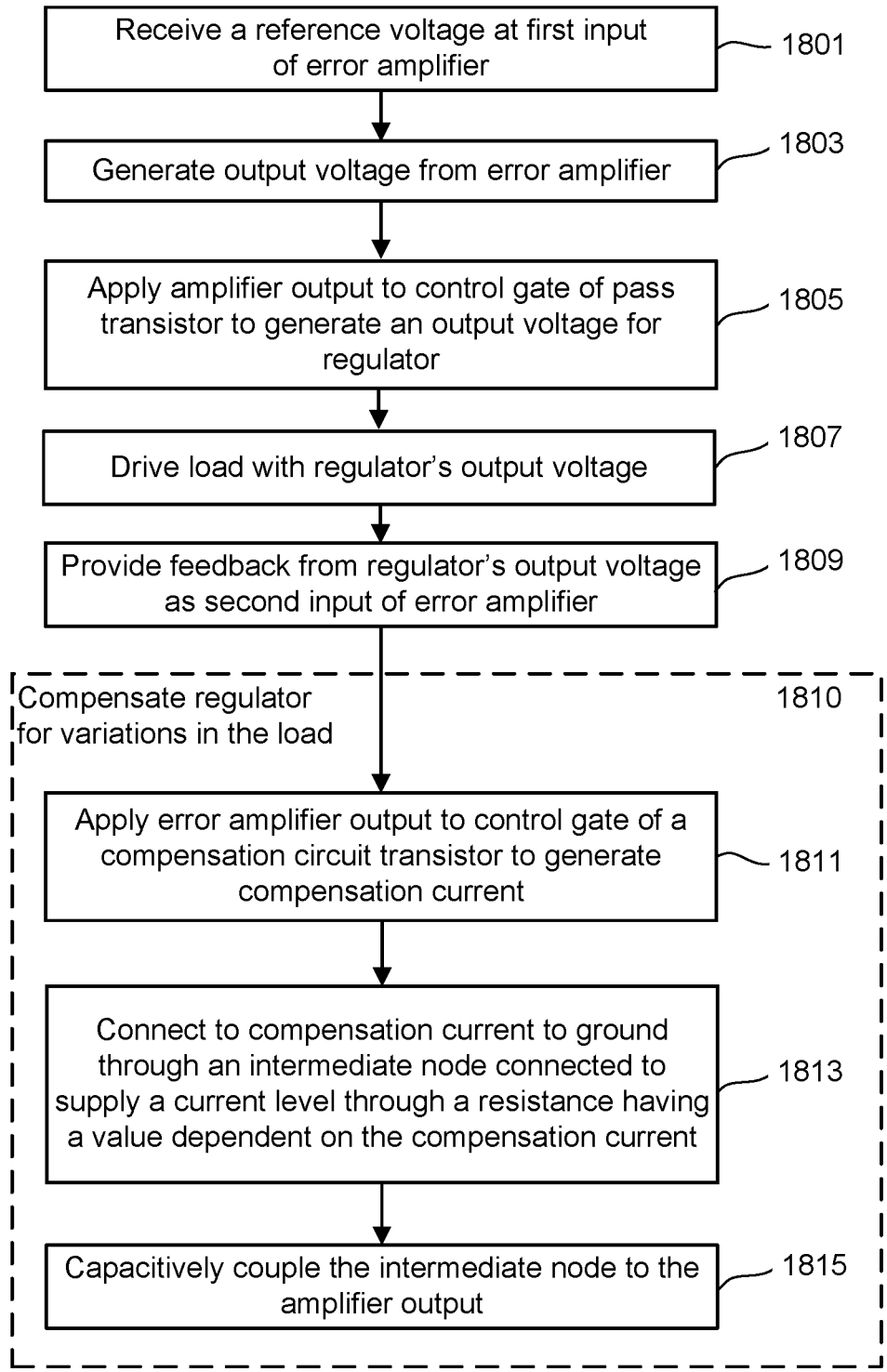
FIG. 18 is a flowchart of an embodiment for compensating a voltage regulator circuit for large dynamic current and capacitive load variations based on the embodiments of FIGS. 11 and 15.

FIG. 18 is a flowchart of an embodiment for compensating a voltage regulator circuit for large dynamic current and capacitive load variations based on the embodiments of FIGS. 11 and 15. Staring at step 1801, the error amplifier 1101/1501 receives a reference voltage (VREF) at a first input (e.g., the − input), where the reference voltage can be generated by a band-gap device, for example. The error amplifier 1101/1501 generates an output voltage (the level on PPG) at step 1803, which is then applied to the gate of a supply, or pass, transistor (MPASS 1111/1511) to generate an output voltage ($V_{OUT}$) for the regulator at step 1805. At step 1807, $V_{OUT}$ is used to drive the load ($C_{OUT}$ 11121/11521, $I_{LOAD}$ 1123/1523, $I_{LEAK}$ 1125/1525). In step 1809 feedback from the regulator's output voltage is provided as a second input of the error amplifier (the + input of 1101/1501). Although represented as a sequence of steps in FIG. 18, these steps and the other steps of FIG. 18 will be occurring concurrently when the regulator circuit is in operation to provide a regulated output voltage to drive the load.

At step 1810 the regulator is compensated by the compensation circuit (1130/1530) for variations in the load. The compensation includes applying the error amplifier's output ($V_{PPG}$) to the gate of a compensation circuit transistor (MPU 1131/1531) to generate a compensation current at step 1811. At step 1813 the compensation current is connected to ground through an intermediate node (above RL 1133 in FIG. 11, below RL 1533 in FIG. 15), where the intermediate node is connected to a supply level (ground in the NMOS based embodiment of FIG. 11/VEXT in the PMOS based embodiment of FIG. 15) through a resistance (MNL 1135/PMNL 1535) having a value dependent on the transconductance of the compensation transistor (e.g., inversely proportional to gm). In the embodiments illustrated above, the compensation current also involves RL1133/RL 1533 and, in FIG. 15, the current mirror of NMOSs 1541 and 1543. In step 1815 the intermediate node capacitively coupled (through CG 1137/1537, connected in series with RU 1139/1539) to the error amplifier's output PPG.

According to a first set of aspects, a voltage regulator circuit includes an input node configured to receive an input voltage, a supply transistor having a control gate connected to receive the input voltage and configured to provide a first current level to an output node in response to the input voltage, and a compensation network. The compensation network includes: a compensation transistor having a control gate connected to receive the input voltage and configured to supply a second current in response to the input voltage; a compensation capacitor; a compensation resistance connected in series with the compensation capacitor between the control gate of the compensation transistor and a first voltage supply level; and a tracking resistance through which the series connected compensation resistance and compensation capacitance are connected to the first voltage supply level, the tracking resistance having a resistance value dependent upon a value of the second current.

Other aspects include a method that includes applying an output of an error amplifier to a control gate of a pass transistor and driving a load with an output of the pass transistor. While driving the load, feedback from the output of the pass transistor is received at a first input of the error amplifier and the output of the pass transistor is compensated for changes in the load. The compensating includes: applying the output of the error amplifier to a control gate of a compensation transistor; generating, in a tracking resistance, a resistance value dependent upon a transconductance of the compensation transistor in response to the output of the error amplifier and connecting the output of the error amplifier to a first voltage supply level through a compensation network of a series connected combination of a compensation capacitor, a compensation resistance, and the tracking resistance.

Yet more aspects include a non-volatile memory circuit comprising: a plurality of non-volatile memory cells; one or more control circuits connected to the non-volatile memory cells and configured to perform memory operations on the non-volatile memory cells; and a voltage supply circuit connected to the one or more control circuits and configured to supply a regulated output voltage for performing the memory operations. The voltage supply circuit includes: a pass transistor configured to provide the regulated output voltage; an error amplifier configured to receive feedback from the output voltage at a first input, a reference voltage at a second input, and having an output connected to a control gate of the pass transistor; and a compensation network. The compensation network includes: a compensation transistor having a control gate connected to the output of the error amplifier and configured to generate a compensation current in response thereto; and a capacitance and a resistance connected in series between the output of the error amplifier and a first voltage supply level, the resistance configured to have a resistance value dependent upon a value of the compensation current.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A voltage regulator circuit, comprising:
    an input node configured to receive an input voltage;
    a supply transistor having a control gate connected to receive the input voltage and configured to provide a first current level to an output node in response to the input voltage; and
    a compensation network, comprising:
        a compensation transistor having a control gate connected to receive the input voltage and configured to supply a second current in response to the input voltage;
        a compensation capacitor;
        a compensation resistance connected in series with the compensation capacitor between the control gate of the compensation transistor and a first voltage supply level; and
        a tracking resistance through which the series connected compensation resistance and compensation capacitance are connected to the first voltage supply level, the tracking resistance having a resistance value dependent upon a value of the second current.

2. The voltage regulator circuit of claim 1, wherein the compensation transistor is connected between a high voltage supply level and a low voltage supply level and the first voltage supply level is the low voltage supply level, and wherein:
    the compensation resistance includes:
        a first resistor; and
        a second resistor, wherein the compensation transistor is connected to the low voltage supply level through a series connected combination of the second resistor and the tracking resistance.

3. The voltage regulator circuit of claim 2, wherein:
    the tracking resistance includes a diode connected NMOS device.

4. The voltage regulator circuit of claim 1, wherein the compensation transistor is connected between a high voltage supply level and a low voltage supply level and the first voltage supply level is the high voltage supply level.

5. The voltage regulator circuit of claim 4, wherein the compensation network further comprises:
    a current mirror comprising:
        a diode connected first mirror transistor through which the compensation transistor is connected to the low voltage supply level; and
        a second mirror transistor having a control gate connected to a control gate of the first mirror transistor,
    wherein the compensation resistance includes:
        a first resistor; and
        a second resistor, wherein the second resistor and the tracking resistance are connected in series between the high voltage supply level and, through second mirror transistor, the low voltage supply level.

6. The voltage regulator circuit of claim 5, wherein:
the tracking resistance includes a diode connected PMOS device.

7. The voltage regulator circuit of claim 1, further comprising:
an error amplifier having a first input configured to receive a reference voltage, a second input connected to receive feedback from the output node, and an output configured to provide the input voltage to the input node.

8. The voltage regulator circuit of claim 7, further comprising:
a band-gap device configured to supply the reference voltage.

9. The voltage regulator circuit of claim 1, wherein:
the supply transistor is a PMOS device connected between a high voltage supply level and the output node.

10. A method, comprising:
applying an output of an error amplifier to a control gate of a pass transistor;
driving a load with an output of the pass transistor;
while driving the load, receiving feedback from the output of the pass transistor at a first input of the error amplifier; and
while driving the load, compensating the output of the pass transistor for changes in the load, the compensating including:
applying the output of the error amplifier to a control gate of a compensation transistor;
generating, in a tracking resistance, a resistance value dependent upon a transconductance of the compensation transistor in response to the output of the error amplifier; and
connecting the output of the error amplifier to a first voltage supply level through a compensation network of a series connected combination of a compensation capacitor, a compensation resistance, and the tracking resistance.

11. The method of claim 10, wherein the tracking resistance is inversely proportional to the transconductance of the compensation transistor.

12. The method of claim 11, wherein:
the compensation transistor is connected between a high voltage supply level and a low voltage supply level;
the first voltage supply level is the low voltage supply level;
the compensation resistance includes a first resistor and a second resistor, the compensation transistor being connected to the low voltage supply level through a series connected combination of the second resistor and the tracking resistance; and
the tracking resistance includes a diode connected NMOS device,
wherein generating the resistance value dependent upon the transconductance of the compensation transistor includes:
draining a current generated by the compensation transistor in response to the output of the error amplifier to the low voltage supply level though the diode connected NMOS device.

13. The method of claim 10, wherein:
the compensation transistor is connected between a high voltage supply level and a low voltage supply level;
the first voltage supply level is the high voltage supply level;
the compensation resistance includes a first resistor and a second resistor, wherein the second resistor and the tracking resistance are connected in series between the high voltage supply level and the low voltage supply level; and
the tracking resistance includes a diode connected PMOS device,
wherein generating the resistance value dependent upon the transconductance of the compensation transistor includes:
mirroring in the diode connected PMOS device a current generated by the compensation transistor in response to the output of the error amplifier.

14. The method of claim 10, further comprising:
while driving the load, receiving a reference voltage at a second input of the error amplifier.

15. The method of claim 14, further comprising:
while driving the load, generating the reference voltage from a band-gap device.

16. A non-volatile memory circuit, comprising:
a plurality of non-volatile memory cells;
one or more control circuits connected to the non-volatile memory cells and configured to perform memory operations on the non-volatile memory cells; and
a voltage supply circuit connected to the one or more control circuits and configured to supply a regulated output voltage for performing the memory operations, the voltage supply circuit comprising:
a pass transistor configured to provide the regulated output voltage;
an error amplifier configured to receive feedback from the output voltage at a first input, a reference voltage at a second input, and having an output connected to a control gate of the pass transistor; and
a compensation network, including:
a compensation transistor having a control gate connected to the output of the error amplifier and configured to generate a compensation current in response thereto; and
a capacitance and a resistance connected in series between the output of the error amplifier and a first voltage supply level, the resistance configured to have a resistance value dependent upon a value of the compensation current.

17. The non-volatile memory circuit of claim 16, wherein the compensation transistor is connected between a high voltage supply level and a low voltage supply level and the first voltage supply level is the low voltage supply level, and wherein:
the resistance of the compensation network comprises:
a series connected first resistor, a second resistor, and a diode connected NMOS device, wherein the compensation transistor is connected to the low voltage supply level through a series connected combination of the second resistor and the diode connected NMOS device.

18. The non-volatile memory circuit of claim 16, wherein the compensation transistor is connected between a high voltage supply level and a low voltage supply level and the first voltage supply level is the high voltage supply level, and wherein:
the compensation network further comprises:
a current mirror comprising:
a diode connected first mirror transistor through which the compensation transistor is connected to the low voltage supply level; and a second mirror transistor having a control gate connected to a control gate of the first mirror transistor, wherein the resistance of the compensation network includes:

a series connected first resistor, a second resistor, and a diode connected PMOS device, wherein the second resistor and the diode connected PMOS device are connected in series between the high voltage supply level and, through second mirror transistor, the low voltage supply level.

19. The non-volatile memory circuit of claim 16, wherein one or more control circuits include one or more sense amplifier circuits and the one or more control circuits are configured to use the regulated output voltage as a sense amplifier supply level.

20. The non-volatile memory circuit of claim 16, wherein one or more control circuits include memory cell biasing circuits and the one or more control circuits are configured to use the regulated output voltage as a memory cell bias voltage in a sensing operation.

\* \* \* \* \*